United States Patent [19]
Bissessur et al.

[11] Patent Number: 6,064,685
[45] Date of Patent: May 16, 2000

[54] SEMICONDUCTOR OPTICAL REFLECTOR AND A METHOD OF MANUFACTURING THE SAME

[75] Inventors: Hans Bissessur, Paris; Catherine Graver, La Norville, both of France

[73] Assignee: Alcatel, Paris, France

[21] Appl. No.: 09/256,307

[22] Filed: Feb. 24, 1999

[30] Foreign Application Priority Data

Feb. 26, 1998 [FR] France .................................. 98 02321

[51] Int. Cl.[7] ...................................................... H01S 3/08
[52] U.S. Cl. .............................. 372/102; 372/20; 372/50; 385/37; 359/572; 359/575
[58] Field of Search .................................. 372/20, 50, 96, 372/99, 102; 385/37; 359/566, 568, 569, 570–575

[56] References Cited

U.S. PATENT DOCUMENTS

| | | | |
|---|---|---|---|
| 5,601,731 | 2/1997 | Hillmer | 216/2 |
| 5,699,378 | 12/1997 | Lealman et al. | 372/102 |
| 5,710,849 | 1/1998 | Little et al. | 385/37 |
| 5,867,304 | 2/1999 | Galvanauskas et al. | 359/333 |

FOREIGN PATENT DOCUMENTS

| | | |
|---|---|---|
| 0 632 298 A2 | 1/1995 | European Pat. Off. . |
| 0 647 867 A1 | 4/1995 | European Pat. Off. . |
| 2 742 235 A1 | 6/1997 | France . |
| 195 00 136 A1 | 7/1996 | Germany . |
| WO93/21671 | 10/1993 | WIPO . |

*Primary Examiner*—Hemang Sanghavi
*Attorney, Agent, or Firm*—Sughrue, Mion, Zinn, Macpeak & Seas, PLLC

[57] ABSTRACT

The invention relates to a semiconductor optical reflector serving in particular for being disposed facing an integrated laser cavity so as to feed light back into said cavity, and enable it to oscillate continuously. The reflector is made up of a plurality of cascaded Bragg reflector sections. More particularly, said sections are of the same length L and have the same coupling coefficient, and the length L of each pair of sections is given by the following relationship:

$$L = \lambda^2 / [(n_{i+1} + n_i) \times 1.7 (n_{i+1}\Lambda_{i+1} - n_i\Lambda_i)]$$

where $\lambda$ is the mean value of the Bragg wavelengths reflected by the reflector;

$n_{i+1}$ and $n_i$ are the respective effective refractive indices of said adjacent sections; and $\Lambda_{i+1}$ and $\Lambda_i$ are the respective periods of said adjacent sections.

The reflector of the invention has a wide spectrum band independent of the value of the coupling coefficient.

8 Claims, 4 Drawing Sheets

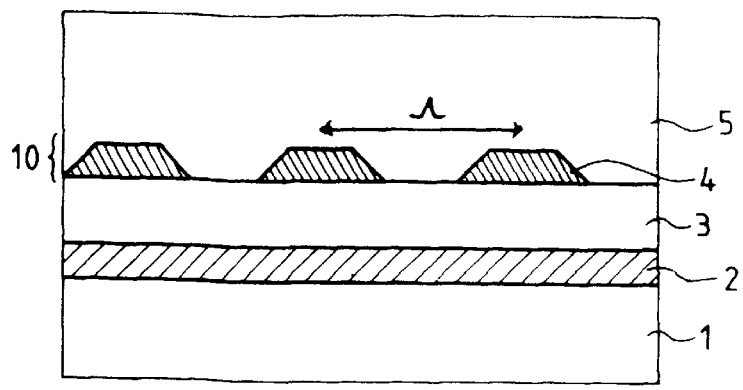
FIG_1A
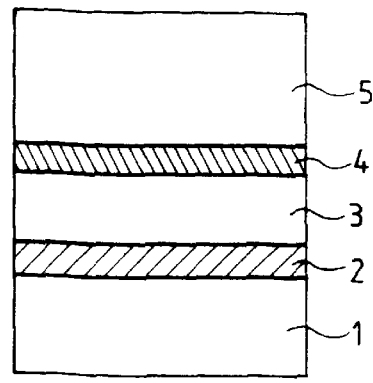
FIG_1B
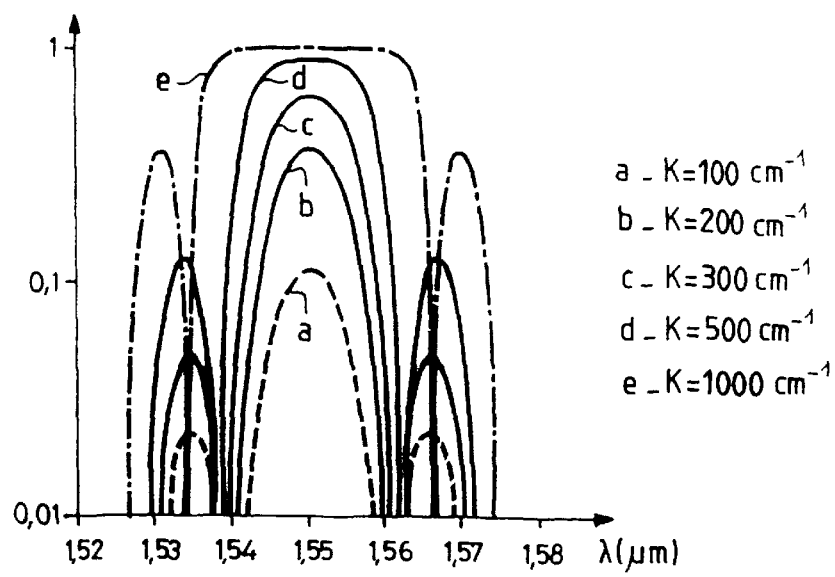
FIG_2
a — K=100 cm$^{-1}$
b — K=200 cm$^{-1}$
c — K=300 cm$^{-1}$
d — K=500 cm$^{-1}$
e — K=1000 cm$^{-1}$

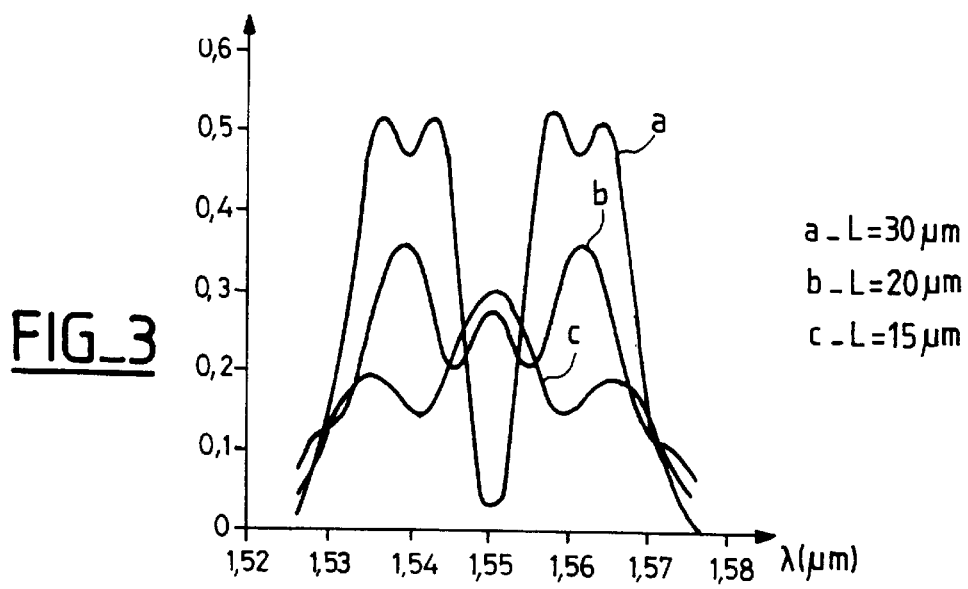
FIG_3
a — L=30μm
b — L=20μm
c — L=15μm
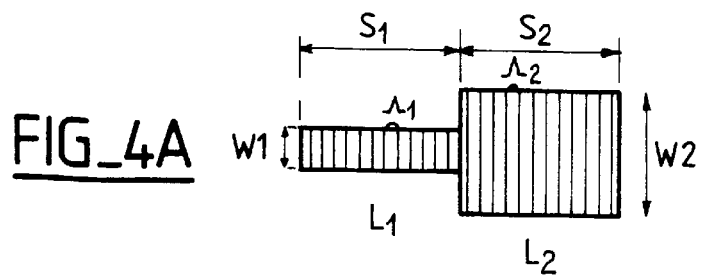
FIG_4A
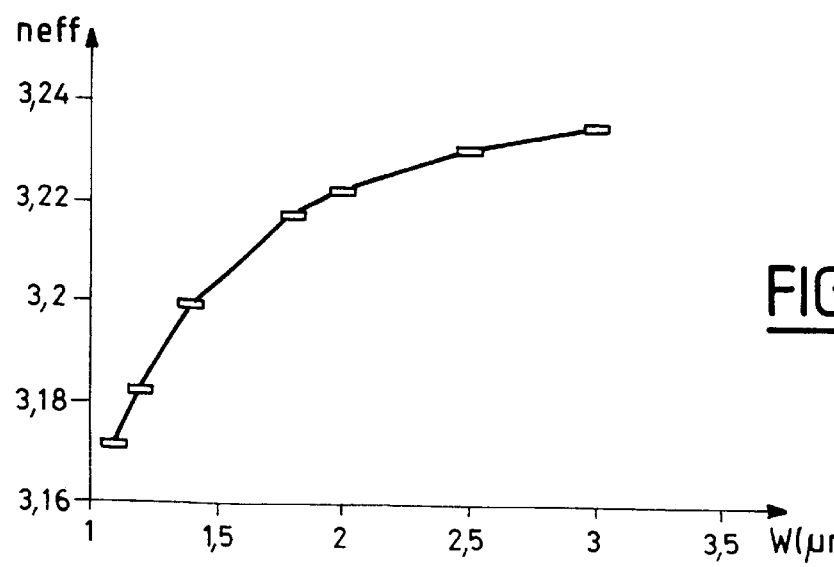
FIG_4B

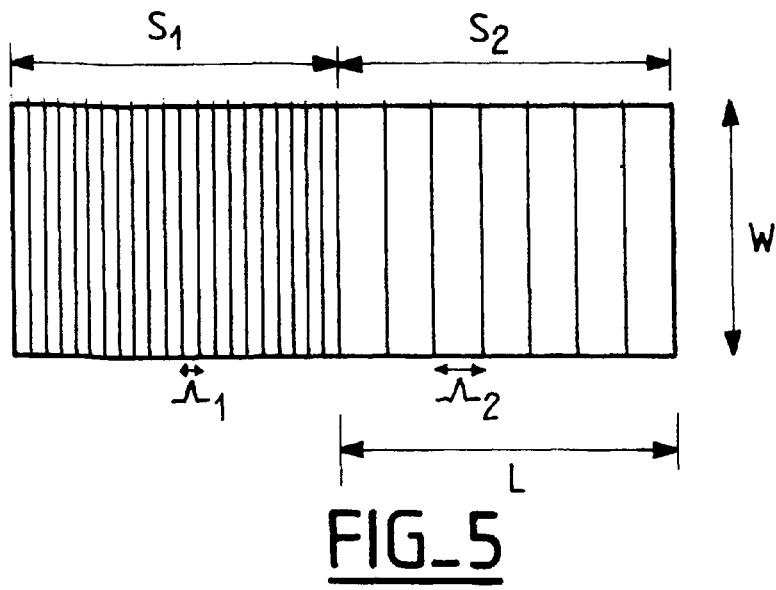
FIG_5
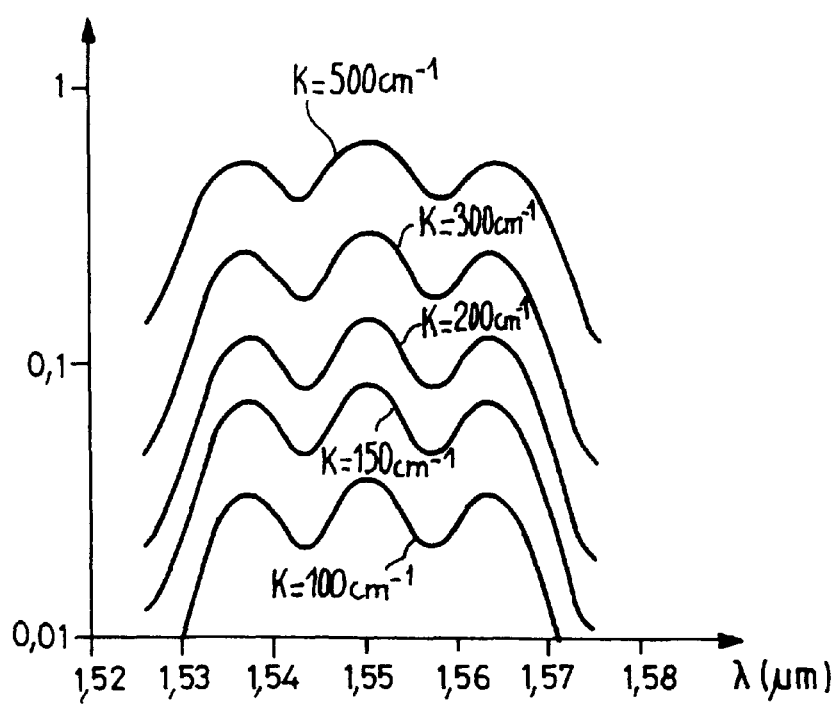
FIG_6

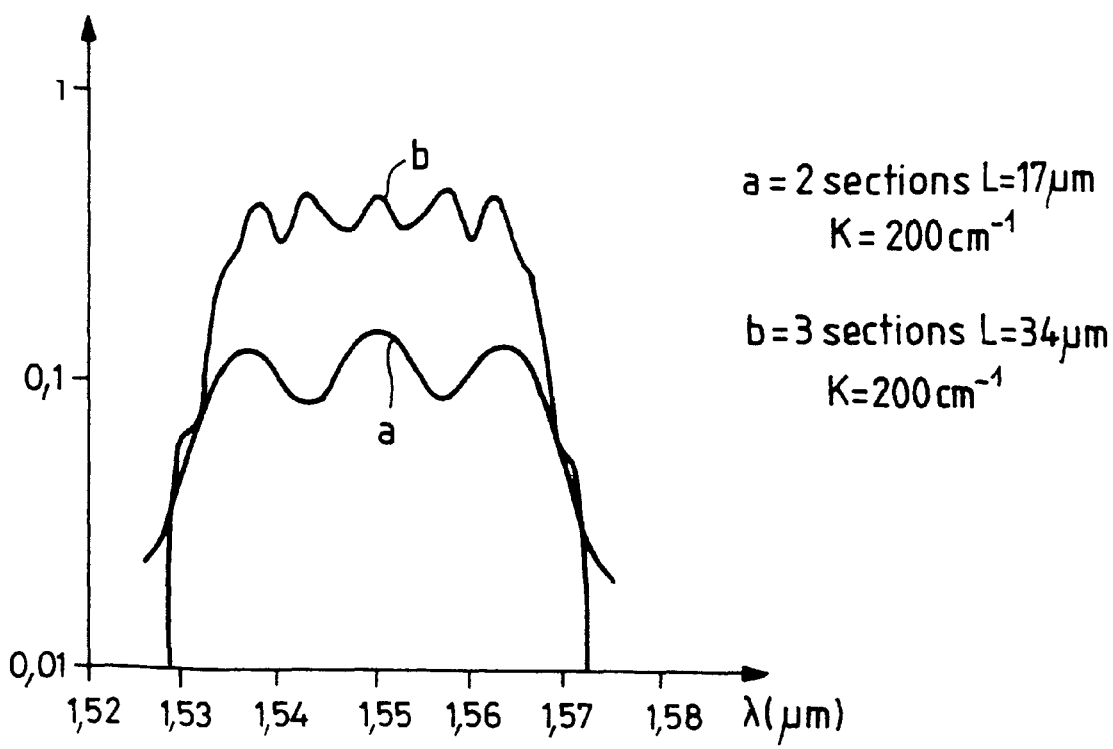
FIG_7

SEMICONDUCTOR OPTICAL REFLECTOR AND A METHOD OF MANUFACTURING THE SAME

The present invention relates to a semiconductor optical reflector and to a method of manufacturing such a reflector. It relates more particularly to an optical reflector comprising a plurality of cascaded Bragg reflector sections.

BACKGROUND OF THE INVENTION

Bragg reflectors make it possible to reflect a portion of the light that they receive. They are commonly used in the field of optical transmission. They can be disposed facing an integrated laser cavity so as to return energy to thereto and so as to enable it to oscillate continuously. In which case, they replace the cleaved-face mirrors of non-integrated semiconductor lasers.

A Bragg reflector is more particularly defined by a periodic grating made up of two materials having different refractive indices. The reflection ratio of such a device depends both on the difference between the indices of the two component materials, and also on the geometrical shape of the grating. It is proportional to the product of κ multiplied by L, where L is the length of the grating, and κ is a coupling coefficient relating both to the difference in the indices of the two materials, and also to the thickness of the grating.

A conventional reflector is shown in longitudinal section in FIG. 1A and in cross-section in FIG. 1B. That reflector is formed on layers 2, 3 stacked by epitaxy on a substrate 1. In general, the substrate 1 is made of indium phosphide (InP) doped with n-type carriers. The layers of the stack perform different optical functions. In the example shown in FIGS. 1A and 1B, an active layer 2, also referred to as the "waveguide", is deposited on the substrate 1. The active layer 2 is buried in a "bottom cladding" layer 3 made of a material of the III-V type, such as InP.

The Bragg grating is referenced 10 in FIG. 1A. It is made up both of a material 4 based on InP, such as, for example, a quaternary material of the GaInAsP type, represented by hatching in FIGS. 1A and 1B, and of an InP material 5 constituting a top cladding layer.

The grating is formed by epitaxially growing a layer 4 of the quaternary material on the bottom cladding layer, by etching the layer 4 to form a crenelated pattern having a period Λ, then by filling in the resulting notches with a top cladding layer 5 of InP doped with carriers. The quaternary material GaInAsP 4 and the InP 5 have different refractive indices which are equal respectively to 3.3 and to 3, and the resulting holographic grating 10 reflects part of the light wave that it receives.

However, as shown in FIG. 2, in order for the spectrum window of that type of grating to be wide enough, i.e. in order to make it possible for the grating to be used for a large number of wavelengths, its coupling coefficient κ must be very high. Thus, as shown by the curves of FIG. 2 which correspond to a conventional grating that is 35 μm long, in order to obtain a spectrum width of about 20 nm, the coupling coefficient κ must be about 500 cm$^{-1}$, and in order to obtain a spectrum width of about 30 nm, the coupling coefficient κ must be about 1000 cm$^{-1}$. Unfortunately, in order to obtain a high coupling coefficient, it is necessary to form a grating that has a large index step and/or large width.

To form such a grating having a high coupling coefficient, a first known solution consists in increasing the thickness of the grating in a manner such that the light wave perceives contrast that is as great as possible. The contrast is related both to the type of the material and to the thickness of the grating, i.e. to the thickness of the layer of quaternary material. Unfortunately, that solution does not, in practice, make it possible to form a reflector that has the desired performance. If the notches formed in the quaternary material are too deep, the filling-in step becomes difficult to perform without degrading the crystal quality of the filling-in material, i.e. of the top cladding layer. Unfortunately, when the crystal quality of said top cladding layer is affected, light propagation losses occur, so that the performance of the device is reduced, and the Bragg coefficient κ does not increase sufficiently to obtain a wide spectrum window.

Another solution has been considered for increasing the index step. That solution consists in etching a holographic grating, obtained conventionally between a quaternary (or ternary) material 4 and a cladding layer is of InP 5, so as to remove the quaternary (or ternary) material selectively, and to form another grating structure having a large index step between air and the InP semiconductor. In which case, the value of the index step is large: about 2. Unfortunately, even though it has a wide spectrum window, that type of grating suffers from numerous interface coupling losses when it is coupled to the waveguide of another device, such as a laser device, for example.

It is therefore difficult to increase the coupling coefficient κ of a holographic Bragg grating without degrading its performance.

OBJECTS AND BRIEF SUMMARY OF THE INVENTION

An object of the present invention therefore consists in finding a solution for making a semiconductor optical reflector that has a wide spectrum band regardless of the value of the coupling coefficient κ, so as to avoid the problems posed by forming a grating having a high coupling coefficient.

A solution for making such a reflector has been studied and consists in manufacturing a grating having a continuously varying period Λ. That solution appears to be advantageous in theory because such a grating has a wide spectrum window independently of the coupling coefficient. Unfortunately, in practice, manufacturing such a grating is a difficult and lengthy process. That type of varying-period grating cannot be manufactured by implementing a conventional method using holographic interference. Another method used to manufacture that type of grating requires as many etching steps as there are different period values. As a result, the implementation difficulty and time are considerably increased, and the efficiency of the method is considerably decreased.

The present invention makes it possible to mitigate the above-mentioned drawbacks because it provides a semiconductor optical reflector that is made up of a plurality of cascaded Bragg reflector sections and that has a wide spectrum window independent of the value of the coupling coefficient.

More particularly, said sections are of the same length L and have the same coupling coefficient, and the length L of each pair of adjacent sections $S_{i+1}$ and $S_i$ is given by the following relationship:

$$L = \lambda^2 / [(n_{i+1} + n_i) \times 1.7(n_{i+1} \times \Lambda_{i+1} - n_i \times \Lambda_i)]$$

where λ is the mean value of the Bragg wavelengths reflected by the reflector;

$n_{i+1}$ and $n_i$ are the respective effective refractive indices of said adjacent sections $S_{i+1}$ and $S_i$; and $\Lambda_{i+1}$ and $\Lambda_i$ are the respective periods of said adjacent sections $S_{i+1}$ and $S_i$.

Using the formula for the length L of the sections of the reflector, it is thus possible to cause its effective period to vary from one section to another, i.e. to vary either its effective refractive index, or its grating period.

Effective refractive index is defined as being the mean refractive index of the medium encountered by a light wave in a section. Effective period is defined as being the product of the period actually inscribed multiplied by the effective refractive index encountered by a light wave in a section.

The method of manufacturing the reflector of the invention differs depending on whether it is the effective refractive index or the period that is varied.

Thus, when the effective refractive index is varied, the manufacturing method consists firstly in forming a conventional stack structure including a holographic Bragg grating having a given period $\Lambda$ and a given coupling coefficient $\kappa$. This method consists secondly in etching said stack structure laterally, so as to form cascaded holographic grating sections, each of which has a different width.

This method is very simple and quick to implement because the holographic grating of the stack structure is formed conventionally, without seeking to increase index step or depth, and the cascaded sections are formed in a single etching step.

When the period $\Lambda$ is varied, the manufacturing method consists firstly in forming a stack structure including a top layer of a ternary material or of a quaternary material serving to be etched to form a holographic grating. This method then consists in:

etching the top layer over a section $S_i$ of length L to form a crenelated pattern having a given period $\Lambda_i$;

successively etching the top layer over a section $S_{i+1}$ adjacent to the preceding section $S_i$, and of the same length L, to form another crenelated pattern having some other period $\Lambda_{i+1}$;

then, after having successively etched the crenelated notches of each section, performing the following steps in either order: etching all of the adjacent sections in a manner such that they all have the same width W; and depositing a cladding layer of a III-V material, so as to fill in the notches and so as to create a plurality of cascaded holographic grating sections, each of which has different period.

This holographic method takes a little longer to implement than the preceding method. However, it remains simple to implement and it is easy to control, unlike the method of manufacturing a grating having a continuously varying period.

BRIEF DESCRIPTION OF THE DRAWINGS

Other features and advantages of the invention appear on reading the following description given by way of non-limiting example and with reference to the accompanying drawings, in which:

FIGS. 1A and 1B, described above, are respectively a longitudinal section view and a cross-section view of a conventional Bragg reflector;

FIG. 2, described above, gives curves showing how the width of the spectrum window of a conventional Bragg reflector varies as a function of its coupling coefficient $\kappa$;

FIG. 3 gives curves showing the profile of the spectrum window of a reflector of the invention as a function of the length L of each of the sections of Bragg grating making up the reflector;

FIG. 4A is a diagrammatic plan view of a first embodiment of a reflector of the invention;

FIG. 4B gives a curve showing the value of the effective refractive index of a section of Bragg grating as a function of its width W;

FIG. 5 is a diagrammatic plan view of a second embodiment of a reflector of the invention;

FIG. 6 gives curves showing the profile of the spectrum window of a reflector of the invention as a function of its coupling coefficient $\kappa$; and FIG. 7 gives curves showing the profile of the spectrum window of a reflector of the invention as a function of the number of adjacent sections.

MORE DETAILED DESCRIPTION

A semiconductor optical reflector of the present invention is advantageously made up of a plurality of cascaded holographic Bragg grating sections. This succession of Bragg grating sections makes it possible, in particular to widen the spectrum window of the reflector while retaining coupling coefficients that are reasonable, i.e. that are lower than 500 $cm^{-1}$.

However, in this type of reflector, the length of each of the cascaded sections is very important and must be controlled because it has considerable influence on the profile of the spectrum window.

The Bragg reflector sections of the reflector of the invention must all have the same length L to obtain a symmetrical spectrum window. If a reflector has two cascaded sections of different lengths, the spectrum window is asymmetrical because a higher reflection peak is created that is centered on the mean wavelength reflected by the longer section.

In addition, in order for the spectrum window of the reflector to be as wide as possible, it must have a profile that is as flat as possible In FIG. 3, the curves a, b, and c show the profile of the spectrum window of a reflector of the invention, made up of two Bragg grating sections of the same length L, where L is equal respectively to 30 $\mu$m, to 20 $\mu$m, and to 15 $\mu$m. The spectrum window has two side reflection peaks and one central peak. In order to obtain a profile that is as flat as possible, it is therefore necessary for the central peak and the side peaks all to have substantially the same reflection ratio. As shown in the figure, if the length L of the sections is too high (curve a: L=30 $\mu$m), then the central peak becomes non-existent while the two side peaks predominate. In which case, the spectrum window is thus separated into two portions. When the length L of the sections is too short (curve c: L=15 $\mu$m) the central peak predominates while the side peaks have lower reflection ratios. In which case, the spectrum window has a break on either side of the central peak.

As a result, when the reflector is made up of two sections only, in order for the spectrum window to be as flat as possible, the length of the sections of the reflector lies in the range 15 $\mu$m to 20 $\mu$m. Preferably, it is equal to 17 $\mu$m.

More generally, the length L of each section of the reflector depends on the effective refractive index and on the grating period of each of the sections. The value of the length L is more particularly given by the following approximate general relationship:

$$L=\lambda^2/[(n_{i+1}+n_i)\times 0.85(\lambda_{Bi+1}-\lambda_{Bi})] \tag{1}$$

where $\lambda$ is the mean value of the Bragg wavelengths reflected by the reflector;

$n_{i+1}$ and $n_i$ are the respective effective refractive indices of the adjacent sections $S_{i+1}$ and $S_i$; and $\lambda_{Bi+1}$ and $\lambda_{Bi}$ are the mean values of the respective Bragg wavelengths reflected by the adjacent sections $S_{i+1}$ and $S_i$.

The values $\lambda_{Bi+1}$ and $\lambda_{Bi}$ also depend on the Bragg grating period of each section. These values are given by the following relationships:

$$\lambda_{Bi+1}=2n_{i+1}\Lambda_{i+1} \quad (2)$$

$$\lambda_{Bi}=2n_i\Lambda_i \quad (3)$$

where $\Lambda_{i+1}$ and $\Lambda_i$ are the respective grating periods of the adjacent sections $S_{i+1}$ and $S_i$.

Using relationships (2) and (3), relationship (1) becomes the following:

$$L=\lambda^2/[(n_{i+1}+n_i)\times 1.7(n_{i+1}\Lambda_{i+1}-n_i\Lambda_i)] \quad (4)$$

In order to make up a reflector of cascaded grating sections having the same length L whose value is chosen in a manner such that the spectrum window is wide, and not less than 30 nm in width, it is therefore necessary to cause the effective period to vary from one adjacent section to another. The effective period is defined as being the product of the period actually inscribed multiplied by the effective refractive index of the medium encountered by a light wave in a grating section. Thus, to cause the effective period to vary, there are two possible methods: it is possible either to cause the effective refractive index $n_i$, $n_{i+1}$ to vary by forming sections of different widths $W_i$, $W_{i+1}$, or to cause the period $\Lambda_i$, $\Lambda_{i+1}$ of the Bragg grating of each section to vary.

FIG. 4A is a diagrammatic plan view of a first embodiment of an optical reflector of the invention. In the example shown, the reflector is made up of two cascaded holographic Bragg grating sections $S_1$, $S_2$. Naturally, the invention is not limited to this example, and the reflector may be made up of more than two sections.

In this example, the two sections $S_1$ and $S_2$ have identical grating periods $\Lambda_1$ and $\Lambda_2$ and identical lengths $L_1$ and $L_2$, but they have different widths $W_1$ and $W_2$. As a result of this difference between the widths W of the two sections $S_1$ and $S_2$, the proportion of air varies on either side of each section. This variation in the proportion of air from one section to the other causes the effective refractive index $n_1$, $n_2$ to vary from one of the two sections $S_1$ and $S_2$ to the other, i.e. the mean guiding index of the medium encountered by a light wave varies from one section to the other.

The curve shown in FIG. 4B indicates how the effective refractive index $n_{eff}$ of each section varies as a function of width W. This curve also indicates that the maximum variation of effective index as a function of width is equal to 3.235−3.170=0.065. It thus makes it possible to know the value of the width of each section for a determined effective index variation corresponding to a chosen section length.

Thus, when an optical reflector is to be made that has a spectrum window of 30 nm centered around the wavelength $\lambda$ equal to 1.55 μm, i.e. of period $\Lambda$ equal to 240 nm, the effective index step $\Delta n_{eff}$ between the two sections, which step depends, in known manner, on the width of the spectrum window of the reflector, is determined and must be equal to 0.05. In which case, if one effective index $n_1$ is chosen to be equal to 3.18, the index $n_2$ of the other section must be equal to 3.18+0.05=3.23. The value of the length L of each section, given by approximate general relationship (4) is then computed on the basis of the values of $n_1$, $n_2$, $\lambda$, and $\Lambda$. In which case, the length L is about 17 μm.

Furthermore, as shown by the curve in FIG. 4B, the width $W_1$ of the section $S_1$ that has an effective index $n_1$ equal to 3.18 must be equal to 1.2 μm, and the width $W_2$ of the section $S_2$ that has an effective index of 3.23 must be equal to 2.5 μm.

The reflector having an effective index that varies from one adjacent grating section to the other is formed merely using a method having a single etching step by means of a mask whose shape corresponds to the shapes of the sections of the reflector to be formed. For this purpose, the method consists firstly in forming a conventional stack structure including a holographic Bragg grating having a given period $\Lambda$ and a given coupling coefficient κ. When a reflector serving to reflect a wave towards a laser cavity is to be formed, the period $\Lambda$ is, for example, set to 240 nm so that the mean value of the wave reflected by the reflector is equal to 1.55 μm. In addition, the Bragg grating is formed in conventional manner, by shallow etching followed by filling in, and it has a coupling coefficient κ that is satisfactory and lower than 500 cm$^{-1}$. Secondly, the resulting stack structure is etched laterally so as to form cascaded holographic grating sections, each of which has a different width W.

The reflector is formed on a substrate made of a III-V material, e.g. made of InP. The holographic Bragg grating. in which the sections are formed is made of a III-V material, e.g. InP, and of a ternary material, e.g. GaInAs, or of a quaternary material, e.g. GaInAsP. In the example described, the adjacent sections include waveguide layers having the same composition.

In a variant embodiment, it is possible to consider forming adjacent sections including waveguide layers of different compositions. However, such a variant complicates the manufacturing method.

FIG. 5 is a diagrammatic plan view of a second embodiment of an optical reflector of the invention. In this embodiment, the cascaded holographic Bragg grating sections $S_1$ and $S_2$ have the same length L, the same, width W, and therefore the same effective refractive index. However, the period $\Lambda_1$, $\Lambda_2$ of each section $S_1$, $S_2$ is different.

The method of manufacturing the reflector consists firstly in forming a stack structure including a top layer of a ternary material or of a quaternary material serving to be etched to form a holographic grating. The top layer is then etched over a first section $S_1$ of length L to form a crenelated pattern having a given period $\Lambda_1$. The top layer is then etched over another section $S_2$ that is adjacent to the preceding section and that is of the same length L, to form another crenelated pattern having some other period $\Lambda_2$. Etching the crenelated notches is thus repeated over each section $S_i$ of the reflector. Finally, after the notches of every section have been etched, all of the adjacent sections are etched so that they all have the same width W, and a cladding layer, e.g. made of a III-V material, is deposited so as to fill in the notches and so as to create a plurality of cascaded holographic grating sections, each of which has a different period. The order in which the last two steps are performed is unimportant. All of the sections may be etched equally well either before or after the notch filling in step.

Since this method requires several steps, it is only used for forming a reflector having a number of sections limited to two or three. When the reflector includes more than three cascaded sections, it is preferably manufactured as in the first embodiment, by causing the effective refractive index to vary from one section to the next.

Regardless of the embodiment, the reflector of the invention has a mirror which is distributed between the various sections $S_i$, $S_{i+1}$.

The curves in FIG. 6 show the profile of the spectrum window of a reflector of the invention made up of two sections, each of which has a length equal to 17 μm, and having an index step of 0.05 as a function of its coupling coefficient κ. This figure shows that the width of the spectrum window varies to a very small extent as a function of the coupling coefficient κ because it is equal to 40 nm when the coupling coefficient κ is equal to 100 cm$^{-1}$, and it is equal to 50 nm when the coupling coefficient κ is equal to 500 cm$^{-1}$. However, the curves confirm that the reflection ratio varies with the coupling coefficient because it is approximately in the range 2% to 3% when κ is equal to 100 cm$^{-1}$, and it increases to about 40% when κ is equal to 500 cm$^{-1}$. As a result, the coupling coefficient κ of the reflector of the invention is chosen depending on the application for which it is to be used, and in particular depending on the type of the laser cavity to which it is to reflect a light wave.

FIG. 7 shows curves showing the profile of the spectrum window of a reflector of the invention as a function of the number of adjacent sections. The curve referenced a shows the profile of the spectrum window of a reflector of the invention made up of two sections, each of which has a length equal to 17 μm, and having a coupling coefficient κ equal to 200 $^{-1}$. The curve referenced b shows the profile of the spectrum window of a reflector of the invention made up of three sections, each of which has a length equal to 34 μm, and having a coupling coefficient κ equal to 200 cm$^{-1}$. These two curves indicate that the greater the number of Bragg grating sections making up the reflector, the flatter the profile of the spectrum window.

These two curves also indicate that the reflection ratio increases with an increasing number of Bragg grating sections making up the reflector. Thus, for a reflector having a coupling coefficient κ equal to 200 cm$^{-1}$, the reflection ratio is about 10% when it is made up of two sections, whereas the reflection ratio is about 50% when it is made up of three sections.

In addition, in this example, the length L of each section is computed for a total effective refractive index variation of 0.05. This means that, when the reflector has two sections, with the respective effective refractive indices of the sections being 3.205 and 3.255, the length L of each section, given by relationship (4), is about 17 μm. In contrast, when the reflector has three sections, the respective refractive indices of the sections are 3.205, 3.23, and 3.255 to obtain a total variation of 0.05. In which case, the length L of each section, given by relationship (4) is about 34 μm.

We claim:

1. A semiconductor optical reflector made up of a plurality of cascaded Bragg reflector sections, wherein said sections are of the same length L and have the same coupling coefficient, and wherein the length L of each pair of sections is given by the following relationship:

$$L = \lambda^2 / [(n_{i+1} + n_i) \times 1.7 (n_{i+1} \Lambda_{i+1} - n_i \Lambda_i)]$$

where λ is the mean value of the Bragg wavelengths reflected by the reflector;

$n_{i+1}$ and $n_i$ are the respective effective refractive indices of said adjacent sections; and $\Lambda_{i+1}$ and $\Lambda_i$ are the respective periods of said adjacent sections.

2. A reflector according to claim 1, wherein the effective refractive index varies from one section to another whereas the period remains identical.

3. A reflector according to claim 1, wherein the width of each section is different.

4. A reflector according to claim 1, wherein the period varies from one section to the next whereas the effective refractive index remains identical.

5. A reflector according to claim 1, wherein, when the reflector is made up of two sections, the length of each of said sections lies in the range 15 μm to 20 μm.

6. A reflector according to claim 1, wherein the adjacent sections include waveguide layers having the same composition.

7. A reflector according to claim 1, wherein the coupling coefficient of said adjacent sections is lower than 500 cm$^{-1}$.

8. A reflector according to claim 1, wherein, when the reflector is made up of two sections, the length of each of said sections equal to 17 μm.

* * * * *